(12) United States Patent
Joensuu

(10) Patent No.: US 6,682,492 B1
(45) Date of Patent: Jan. 27, 2004

(54) ARRANGEMENT FOR THE EXAMINATION OF AN OBJECT

(76) Inventor: Raimo Joensuu, Oksasenkatu 7 A 53, FIN-00100, Helsinki (FI)

( * ) Notice: Subject to any disclaimer, the term of this patent is extended or adjusted under 35 U.S.C. 154(b) by 0 days.

(21) Appl. No.: 09/830,339

(22) PCT Filed: Nov. 2, 1999

(86) PCT No.: PCT/FI99/00914
§ 371 (c)(1),
(2), (4) Date: Apr. 26, 2001

(87) PCT Pub. No.: WO00/25670
PCT Pub. Date: May 11, 2000

(30) Foreign Application Priority Data

Nov. 3, 1998 (FI) ................................. 982378

(51) Int. Cl.$^7$ ............................................. A61B 5/08
(52) U.S. Cl. ..................................................... 600/561
(58) Field of Search ........................ 600/561, 420, 600/419, 485, 407, 410; 324/306, 307, 309, 316; 73/700

(56) References Cited

U.S. PATENT DOCUMENTS

| | | | |
|---|---|---|---|
| 4,572,198 A | 2/1986 | Codrington | 128/653 |
| 4,618,978 A | 10/1986 | Cosman | 378/164 |
| 4,719,425 A | 1/1988 | Ettinger | 324/316 |
| 4,827,931 A | 5/1989 | Longmore | 128/334 |
| 4,891,593 A | 1/1990 | Lurie et al. | 324/307 |
| 4,984,573 A * | 1/1991 | Leunbach | 600/420 |
| 4,989,608 A | 2/1991 | Ratner | 128/653 |
| 5,146,824 A * | 9/1992 | Lajoie | 83/90 |
| 5,154,603 A * | 10/1992 | Sepponen | 600/410 |
| 5,155,435 A | 10/1992 | Kaufman et al. | 324/309 |
| 5,184,076 A | 2/1993 | Ehnholm | 324/318 |
| 5,188,111 A | 2/1993 | Yates et al. | 128/657 |
| 5,203,332 A | 4/1993 | Leunbach | 128/653 |

(List continued on next page.)

FOREIGN PATENT DOCUMENTS

| | | | |
|---|---|---|---|
| DE | 3934919 | * | 10/1988 |
| DE | 3937052 | * | 11/1988 |

OTHER PUBLICATIONS

Potenza J., "Measurement and Applications of Dynamic Nuclear Polarization." *Advan. Mol. Relaxation Processes*, 4 (1972) pp. 229–354.

(List continued on next page.)

*Primary Examiner*—Sang Y. Paik
*Assistant Examiner*—Daniel Robinson
(74) *Attorney, Agent, or Firm*—Blank Rome LLP

(57) ABSTRACT

An operation instrument for the examination of an object, for example a biopsy needle, a catheter, or a radioactive capsule intended for radiotherapy. The instrument comprises an active component which is adapted to be detected with a nuclear magnetic resonance method, such as magnetic imaging, in such a way that the active component contains a marker which carries NMR-active nuclei and, in interaction with the marker, an enhancer which causes the enhancement of an NMR signal by means of dynamic nuclear polarization as a result of saturating the electron spin system of the enhancer which causes the enhancement of an NMR signal by means of dynamic nuclear polarization as a result of saturating the electron spin system of the enhancer with an external energy, so-called saturation energy. The operation instrument comprises a marker container and a transfer linen for transferring the saturation energy into the enhancer. The marker is housed in a metal foil, and a boundary surface between the transfer line and the marker container is tapered. The transfer line is provided with an inner conductor extending into the marker container over a substantial distance into the interior of the container.

14 Claims, 3 Drawing Sheets

U.S. PATENT DOCUMENTS

| | | | | |
|---|---|---|---|---|
| 5,211,166 A | * | 5/1993 | Sepponen | 600/420 |
| 5,218,964 A | * | 6/1993 | Sepponen | 600/414 |
| 5,271,400 A | | 12/1993 | Dumoulin et al. | 128/653.2 |
| 5,303,707 A | | 4/1994 | Young | 128/653.2 |
| 5,307,808 A | | 5/1994 | Dumoulin et al. | 128/653.2 |
| 5,314,681 A | | 5/1994 | Leunbach et al. | 424/9 |
| 5,318,025 A | | 6/1994 | Dumoulin et al. | 128/653.2 |
| 5,353,795 A | | 10/1994 | Souza et al. | 128/653.2 |
| 5,365,927 A | | 11/1994 | Roemer et al. | 128/653.2 |
| 5,409,003 A | | 4/1995 | Young | 128/653.2 |
| 5,419,325 A | | 5/1995 | Dumoulin et al. | 128/653.2 |
| 5,435,991 A | | 7/1995 | Golman et al. | 424/9.33 |
| 5,445,151 A | | 8/1995 | Darrow et al. | 128/653.3 |
| 5,447,156 A | | 9/1995 | Dumoulin et al. | 128/653.2 |
| 5,530,140 A | | 6/1996 | Andersson et al. | 549/31 |
| 5,744,958 A | | 4/1998 | Werne | 324/318 |
| 5,782,764 A | | 7/1998 | Werne | 600/411 |
| 6,108,574 A | * | 8/2000 | Ardenkjaer-Larsen | 600/420 |
| 6,154,179 A | | 11/2000 | Kohno | 343/719 |
| 6,298,259 B1 | * | 10/2001 | Kucharczyk et al. | 600/411 |
| 6,453,188 B1 | * | 9/2002 | Ardenkjaer-Larsen et al. | 600/420 |
| 6,535,755 B2 | * | 3/2003 | Ehnholm | 600/423 |
| 6,574,496 B1 | * | 6/2003 | Golman et al. | 600/420 |

OTHER PUBLICATIONS

Mueller, P.R. et al., "MR–guided Aspiration Biopsy: Needle Design and Clinical Trials." *Radiology*, pp. 605–609, Dec. 1986.

Roschmann, P., "Radiofrequency Penetration and Absorption in the Human Body: Limitations to High–field Whole–body Nuclear Magnetic Resonance Imaging." *Med. Phys.* 14(6), pp. 922–931, Nov./Dec. 1987.

Lurie, D.J., et al., "Proton–Electron Double Magnetic Resonance Imaging of Free Radical Solutions." *Journal of Magnetic Resonance 76*, pp. 366–370 (1988).

Lufkin, R., et al., "A Technique for MR–Guided Needle Placement." *ARJ*: 151, pp. 193–196, Jul. 1988.

vanSonnenberg, E., et al., "A Wire–Sheath System for MR–Guided Biopsy and Drainage: Laboratory Studies and Experience in 10 Patients." *ARJ*: 151, pp. 815–817, Oct. 1988.

Lufkin, R., et al., "MR Body Stereotaxis: An Aid for MR–Guided Biopsies." *Journal of Computer Assisted Tomography*, vol. 12, No. 6, pp. 1088–1089, Nov./Dec. 1988.

Leung, D.A., et al., "Intravascular MR Tracking Catheter: Preliminary Experimental Evaluation." *ARJ*: 164, pp. 1265–1270, May 1995.

Silverman, S.G. et al., "Interactive MR–guided Biopsy in an Open–Configuration MR Imaging System." *Radiology*, pp. 175–181, Oct. 1995.

Bakker, C.J. et al., "Visualization of Dedicated Catheters Using Fast Scanning Techniques with Potential for MR–guided Vascular Interventions." *MRM* 36, pp. 816–820 (1996).

Joensuu, R.P.J., et all., "Interventional MR Imaging." *Acta Radiologica* 38, pp. 43–36 (1997).

Ocali, O. et al., "Intravascular Magneteic Resonance Imaging Using a Loopless Catheter Antenna." *MRM* 37, pp. 112–118 (1997).

Glowinski, A. et al., "Catheter Visualization Using Locally Induced, Actively Controlled Field Inhomogeneities." *MRM* 38, pp. 253–258 (1997).

Joensuu, R.P., et al., "High–Accuracy MR Tracking of Interventional Devices: The Overhauser Market Enhancement (OMEN) Technique." *MRM* 40, pp. 914–921 (1998).

\* cited by examiner

ARRANGEMENT FOR THE EXAMINATION OF AN OBJECT

The present invention relates to the examination of an object, such as a human body, for example, and possibly to the simultaneous guidance of a treatment procedure.

The nuclear magnetic resonance phenomenon (NMR) has already been applied in medicine to magnetic resonance imaging (MRI) for more than ten years. The design of various pieces of magnetic imaging equipment and the use of various techniques have been dealt with in a number of books and the latest research results are currently published in several scientific journals focusing exclusively on that particular field.

A common feature for all magnetic imaging devices is the positioning of an object to be imaged, often a patient, in a stationary magnetic field $B_{01}$ which is produced by a magnet. In addition to this, the magnetic field is subjected to a linear magnetic-field change, a gradient, which is effected by means of a special gradient coil. The magnetic imaging devices are provided with three gradients $G_x$, $G_y$, and $G_z$, which represent the change of a magnetic field in the direction of an x, y, and z axis, respectively. The gradients are used for encoding positional information from the magnetically resonating material, most commonly protons, of an object to be imaged, by frequency-modulating the resonance. The signal for magnetic imaging is produced by means of radio-frequency (RF) coils, which excite the resonance and function as a signal receiver. The signal is analyzed (Fourier-transformed) for its frequency content, thereby determining a signal distribution in the direction to be examined. The literature discloses a variety of methods for applying this basic technique for producing 2- or 3-dimensional images by using special imaging sequences, which are all based on the encoding of an NMR signal effected by means of gradients in x, y, and z directions.

The open-configuration magnetic imaging equipment offers a possibility of performing procedures, for example biopsies, during patient imaging. Certain objects, for example brain tumors, osteopecilia, soft tissue transformations, or liver tumors, are best discernible in magnetic imaging and, thus, the procedure would be most precisely applicable in the guidance of magnetic imaging. However, this requires that the position of an operation instrument in a tissue during the procedure be known with high accuracy.

Prior known are operation instruments disclosed in reference Longmore: U.S. Pat. No. 4,827,931, which are completely or partially made of a material visible in a normal magnetic image. Prior known are also methods disclosed in references Werne R: WO 98/22022, Werne R: U.S. Pat. No. 5,782,764, Ratner A: U.S. Pat. No. 4,989,608, Ratner A: U.S. Pat. No. 5,154,179, wherein an operation instrument is provided either in a container or otherwise with an NMR active substance, having a relaxation time which is different from that of the tissue, for creating a contrast distinction between the operation instrument and the tissue. It is characteristic of these methods that the NMR signal emitted by these instruments is not enhanced, but the visibility is only based either on a high density (e.g. water) of the nuclei emitting the NMR signal or on a relaxation time other than that of the tissue. Thus, the visibility of these instruments in a tissue is weak and requires that the imaging process be performed by using either very thin slices or by selecting such imaging sequences that the surrounding tissue provides very little signal. The use of thick slices in imaging is desirable, e.g. when monitoring the progress of an instrument in a curved blood vessel or generally when using pliable instruments, e.g. thin needles. In terms of monitoring a procedure, it is preferable to obtain sufficient signal from a tissue in order to make the surrounding tissue visible simultaneously with the instrument. There are prior known extra-object stereotactical frames as set forth in reference Cosman E: U.S. Pat. No. 4,618,978, which enable determining the position of the object in a tissue. Prior known is the use of operation instruments disclosed in references: Mueller P et al.: MR-guided aspiration biopsy: needle design and clinical trials, Radiology 161 pp. 605–609 (1986), Lufkin R et al.: MR body stereotaxis: an aid for MR-guided biopsies, Journal of Computer Assisted Tomography 6 pp. 1088–1089 (1988), van Sonnenberg E, et al.: A wiresheath system for MR-guided biopsy and drainage, AJR 151 pp. 815–817 (1988), Lufkin R. Teresi L, Chiu L, Hanafee W: A technique for MR-guided needle placement, AJR 151 pp. 193–196 (1988), Bakker C, Hoogeveen R, Weber J, et al.: Visualization of dedicated catheters using fast scanning techniques with potential for MR-guided vascular interventions, Cordington R: U.S. Pat. No. 4,572,198, Magnetic Resonance in Medicine 36 pp. 816–820 (1996), Glowinski A, Adam G, Bucker A, et al.:Catheter visualization using locally induced, actively controlled field inhomogeneities, Magnetic Resonance in Medicine 38 pp. 253–258 (1977), which cause the weakening of an image signal from the area of an operation instrument and its immediate vicinity. Also prior known is an instrument set forth in reference Werne R: U.S. Pat. No. 5,744,958, which is fitted with a conductive foil. The instrument is not provided with its own source for an NMR-frequency signal, nor is the foil transparent to an NMR-frequency signal, but the instrument has its visibility based on the distortion of a surrounding-tissue emitted signal in the vicinity of the instrument, and the intensity of distortion is controlled by the foil thickness. The positional information produced by the above-described operation instruments is generally perceived as a loss of the signal, while positive contrast would be desirable.

According to reference Dumoulin C: U.S. Pat. No. 5,419,325, it is prior known to fit the instrument with a Faraday shield for protection against external RF excitation. Prior known is a method disclosed in reference Young I: U.S. Pat. No. 5,409,003, wherein the nuclei emitting an image signal perform limited motion in the vicinity of the surface of an instrument, and no fading of the signal as a result of diffusion shall occur. Reference Yates D: U.S. Pat. No. 5,188,111 anticipates an instrument, having a stem portion which is pliable in a tissue and whose end carries a sensor capable of tracking action.

Prior known is a method described in references Dumoulin et al.: U.S. Pat. No. 5,271,400, Dumoulin et al.: U.S. Pat. No. 5,307,808, Dumoulin et al.: U.S. Pat. No. 5,318,025, Souza et al.: U.S. Pat. No. 5,353,795, Leung D A, et al.: Intravascular. MR tracking catheter, AJR 164 pp. 1265–1270 (1995), wherein the operation instrument is fitted with one or more small-sized RF coils, whose position is detected by means of an imaging method applied in magnetic imaging. Furthermore, references Darrow et al.: U.S. Pat. No. 5,445, 151, Dumoulin et al.: U.S. Pat. No. 5,447,156 describe, as an application of this technique, the imaging of blood vessels and the measurement of parameters associated with circulation. Reference Young I: U.S. Pat. No. 5,303,707 discloses a method, wherein a small-sized gradient coil is attached to the instrument. Prior known is also a method according to reference Ocali O. et al: Intravascular magnetic resonance imaging using a loopless catheter antenna, Magnetic Resonance in Medicine 37 pp. 112–118 (1997), wherein the catheter functions as NMR-frequency antenna and gathers a tissue signal from the immediate vicinity of the antenna. Prior known are methods set forth in references: Silverman S et al.: Interactive MR-guided biopsy in an open-configuration MR-imaging system, Radiology 197 pp. 175–181 (1995), as well as Roemer P. et al: U.S. Pat. No. 5,365,927, wherein fixing the position of an operation instrument is based on detecting the position of small transmitters mounted on the stem portion. One prior known method is described in reference Kaufman L: U.S. Pat. No. 5,155,435, wherein the position of an operation instrument is projected on top of a previously acquired anatomical image. The above methods are sensitive to motion, as well as to the inhomogeneities of a magnetic field and gradient fields, since the imaging of the anatomical structure of an object is carried out by a method other than the one used for determining the position of an operation instrument. Prior known is a method disclosed in reference Golman K, Leunbach I, Adrenkjaer-Larsen et al.: Overhauser-enhanced MR imaging (OMRI) Acta Radiologica 39 pp. 10–17 (1997), wherein the blood circulation or a tissue is injected with a contrast medium or marker, the signal emitted thereby being enhanced by making use of dynamic nuclear polarization. Reference Sepponen R: U.S. Pat. No. 5,211,166 describes a principle, wherein the NMR-frequency signal emitted by a marker sample placed in an operation instrument is enhanced by means of dynamic nuclear polarization. Prior known is a stereotactical frame, disclosed in reference Sepponen R: U.S. Pat. No. 5,218,964 and based on the same principle. Prior known methods are set forth in references Joensuu R, Sepponen R. Lamminen A, Standertskjöld-Nordenstam C-G, Interventional MR imaging: Demonstration of the feasibility of the Ovcerhauser marker enhancement (OMEN) technique, Acta Radiologica 38 pp. 43–46 (1997), Joensuu R, Sepponen R, Lamminen A, Savolainen S, Standertskjöld-Nordenstam C-G, Hieh-accuracy MR tracking of interventional devices: the Overhauser marker enhancement (OMEN) technique, Magnetic Resonance in Medicine 40(6) pp. 914–921 (1998), wherein dynamic nuclear polarization is used for enhancing an NMR-frequency signal emitted by a marker sample, which is placed in an operation instrument and which is electromagnetically open with respect to its environment.

Dynamic nuclear polarization (DNP) is a magnetic double-resonance method, which thus necessitates two separate spin populations. Such spin populations are constituted for example by the spins of electrons and protons. In DNP, a paramagnetic material, hereinafter an enhancer, functions as a source for the transitions of an electron spin resonance (ESR) and it is interaction, generally in a blended form, with an NMR-signal emitting medium, for example water. This blend or composition, hereinafter a contrast medium or a marker, is exposed to a first radiation, having its frequency and amplitude selected in view of exciting some or all of the ESR transitions of the enhancer (this is generally a microwave-range frequency and, thus, such radiation is hereinafter referred to as microwave radiation). In order to produce a magnetic image, the object is exposed to a second radiation, having its frequency selected in view of exciting the nuclear spin transitions in imaging nuclei. The result is an improved magnetic image of a marker-containing object, the image having its signal strength enhanced with a factor that may be 100 or higher.

Dynamic nuclear polarization and enhancers applicable therein are dealt with e.g. in references Potenza, J.: Measurement and applications of dynamic nuclear polarization. In: Advances in molecular relaxation processes, 4 pp. 229–354, Elsevier Publishing Company, Amsterdam (1972), Leunbach I: U.S. Pat. No. 5,314,681, Andersson S. et al.: U.S. Pat. No. 5,530,140, Golman K: U.S. Pat. No. 5,435,991.

References Leunbach I: U.S. Pat. No. 4,984,573 and Leunbach I: U.S. Pat. No. 5,203,332 disclose DNP-compatible magnetic imaging devices, and reference Ehnholm G: U.S. Pat. No. 5,184,076 discloses a DNP-compatible imaging coil configuration. Reference Maciel G, Davis M: NMR imaging of paramagnetic centers in solid via dynamic nuclear polarization, Journal of Magnetic Resonance 64 pp. 356–360 (1985) describes a method fit for the mapping of paramagnetic components by combining the DNP and MRI methods. Reference Lurie et al.: U.S. Pat. No. 4,891,593 shows the mapping of paramagnetic components as an application. Reference Ettinger K: U.S. Pat. No. 4,719,425 discloses, as applications, the mappings of the contents of paramagnetic components and the activity of cerebral nerve cells. Reference Lurie D, Bussel D, Bell L, Mallard J: Proton-electron double magnetic resonance imaging of free radical solutions, Journal of Magnetic Resonance 76 pp. 366–370 (1988) discloses, as possible applications, the mappings of free radical groups, nitroxide radicals, and degree of oxidation.

A fundamental benefit gained by DNP the NMR-signal-to-noise ratio of an object can be greatly improved. By virtue of this, the marker-containing object can be very small in size, and yet it has a better visibility in a magnetic image than for example the surrounding tissue.

However, DNP has its limitations. Since the resonance line of ESR has a considerable width, the saturation of a marker requires the use of a high power, which in current technology can only be produced by using expensive power amplifiers. Another problem is the tendency of microwave radiation to heat up the object. Hence, with an object of a given size and shape and with a given imaging capacity, the power $P_a$ absorbed by the object is proportional to the squares of the amplitude $A_m$ and frequency $f_m$ of microwave radiation. Consequently, $$P_a = k_o f_m^2 A_m^2 D_m \qquad (1)$$

wherein $k_o$ is a constant and $D_m$ is the active period of microwave radiation, which, as a result of being absorbed in a tissue, may cause damage thereto (excessive heating).

The interaction between electromagnetic radiation and a biological tissue has been dealt with e.g. in reference: R öschmann P: Radiofrequency penetration and absorption in the human body: Limitations to high field whole body nuclear magnetic resonance imaging, Medical Physics 14(6) pp. 922–931 (1987).

In practice, the tracking of a catheter, a surgical instrument, a biopsy needle, or a radiotherapeutical charge, generally an operation instrument, with respect to various tissues must be performed at a precision as high as possible. Hereinbelow, the location of an instrument interesting at any given moment will be referred to as an operation site. This requires that a high contrast and a good signal-to-noise ratio be achieved in imaging between said instrument or a part thereof and the tissue of an operation site. In addition, the operation instrument must not damage the tissue more than what is necessary for guiding the instrument to the operation site. Furthermore, the operation instrument must be reliable in operation in all conditions, readily cleanable, and easy to use, as well as preferably attractive in terms of its price.

The objectives of the invention are achieved on the basis of claim 1 or claim 2. Preferred embodiments are set forth in the subclaims.

The invention will now be described in more detail with reference to the accompanying drawings.

Figure 1:
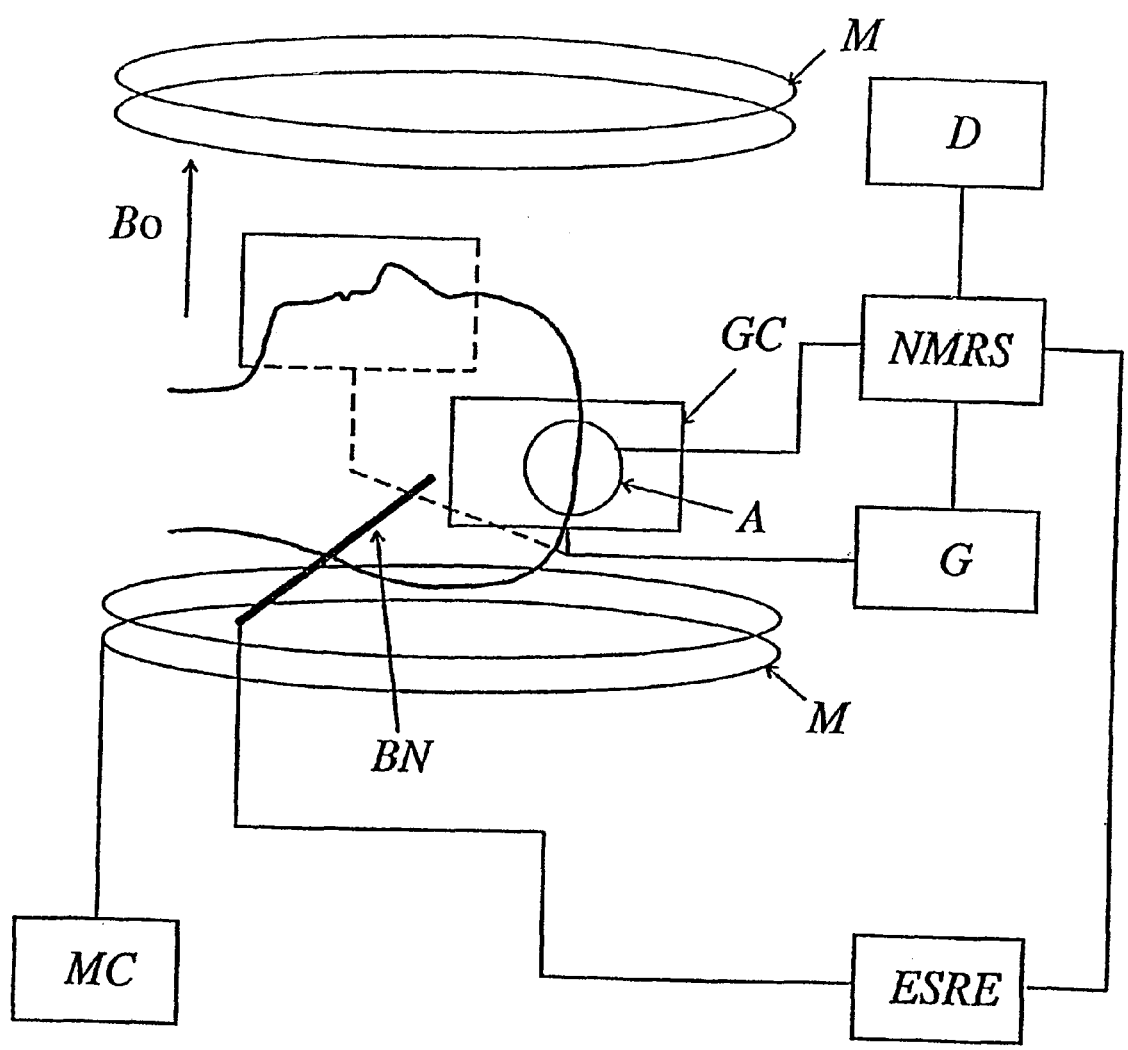
FIG. 1 shows an apparatus designed for performing an interventional procedure.

In FIG. 1, a patient or some other object to be examined is placed in a polarizing magnetic field $B_0$, generated by a magnet M and a power source supplying a current thereto, as a result of which the object develops a nuclear magnetization and a magnetization generated by electron spins; an object P is further surrounded by gradient coil assemblies GC, the strength of gradient fields generated thereby being controlled an NMR-spectrometer NMRS through the intermediary of gradient power sources G; NMRS controls also a radiofrequency transmitter ESRE generating the energy (saturation energy) saturating the electron spin system of materials present in the vicinity of some part of an operation instrument BN; NMRS contains necessary radiofrequency components for producing an NMR-signal by way of antenna devices A and receiving the same for necessary procedures, as well as for storing and processing the signal; the final imaging result is presented on a display D.

The NMR test arrangement comprises a magnet (a resistive, permanent, or superconductive magnet or even a geomagnetic field) required for generating the magnetic field $B_0$, an NMR spectrometer, as well as antenna devices. In addition to the above, the magnetic imaging arrangement comprises gradient coil assemblies and controllable power sources, means for the reconstruction and display of an image.

Figure 2A:
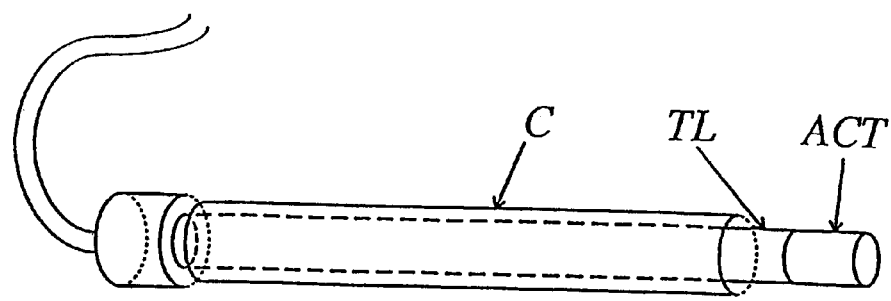
FIG. 2 illustrates the working of an operation instrument at various stages of an interventional procedure.
Figure 2B:
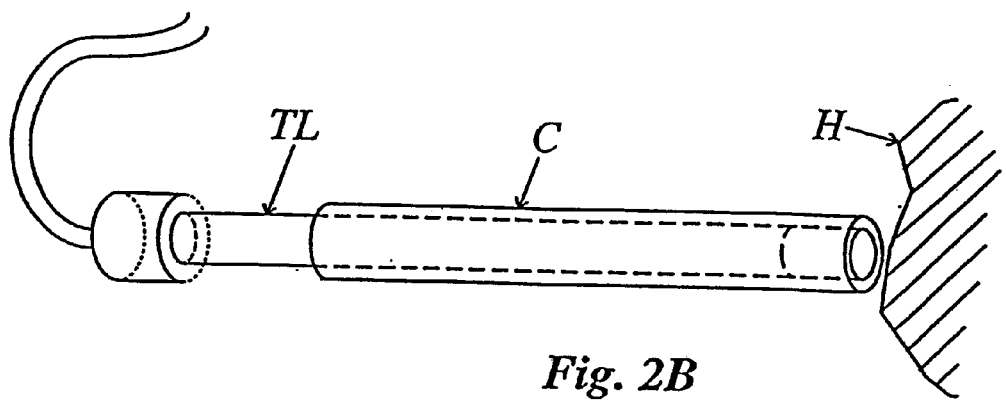

FIG. 2 depicts in more detail an operation instrument regarding its working and design which can be cylindrical, as shown in FIG. 2. In FIG. 2A, the operation instrument has its microwave element inside a cylinder C, such that the microwave element has its marker-containing portion ACT outside the cylinder. The guidance of the operation instrument into an object in a soft tissue is effected with the microwave element in this position. In FIG. 2B, the marker-containing portion ACT of the microwave element is also inside the cylinder C.

Figure 2C:
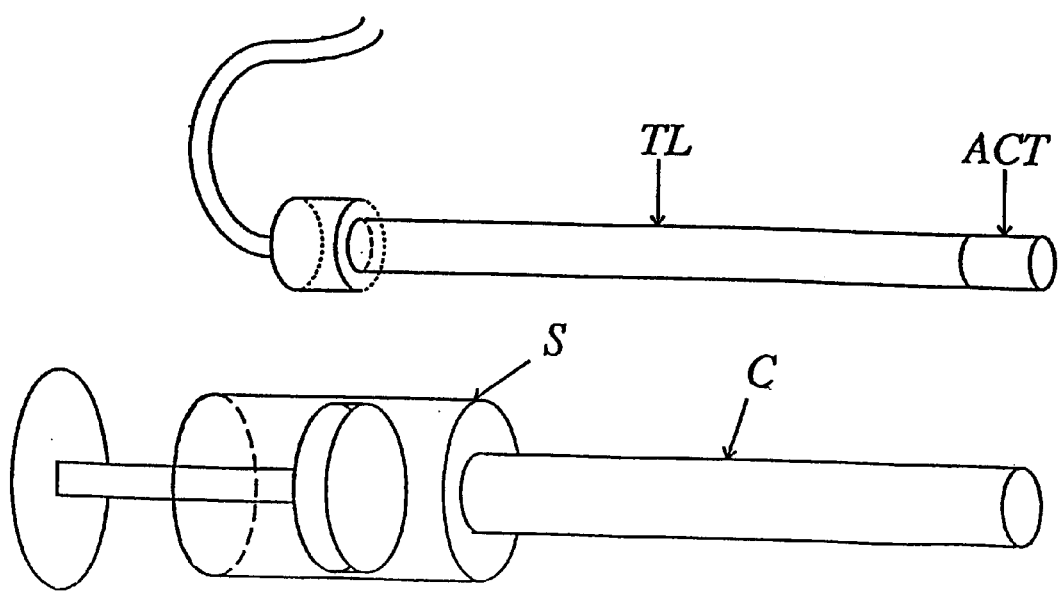

In the operation instrument of the invention, this occurs automatically upon pressing the instrument against a hard tissue H, for example bone. The marker-containing portion returns outside the cylinder as soon as the pressing against a hard tissue is terminated. In FIG. 2C, the operation instrument has its microwave portion completely extended from within the cylinder C and the cylinder is fitted with a suction intake S. Taking a tissue sample can be effected this way by using the cylinder element of an operation instrument as a sampling needle.

Figure 3:
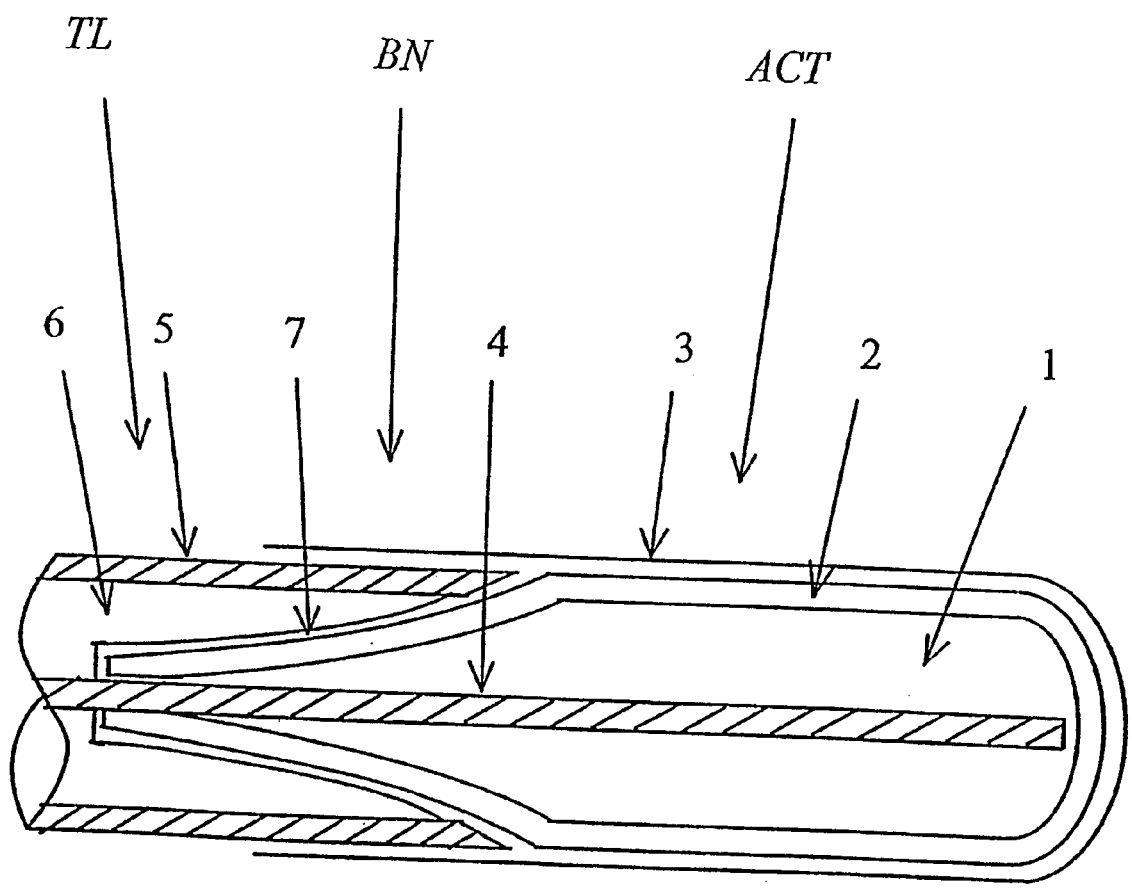
FIG. 3 shows in more detail one optional design for the operation instrument.

FIG. 3 shows in more detail the microwave element of an operation instrument BN, regarding its design. In FIG. 3, the marker-containing portion ACT has one of its ends tapered 7 and the tapering is partly or completely within a sheath 5 of a transfer line TL. The tapering design 7 is used for minimizing reflection losses of saturation power, caused by various electromagnetic properties of a transfer line insulator 6, a marker 1, as well as a marker container 2. The transfer line TL also has its sheath 5 provide a mechanical support for the active element ACT of the operation instrument BN. The transfer line TL has its inner conductor 4 extend to the interior of the marker container 2 into the marker 1, and the saturation power progresses by means of the inner conductor 4 from the transfer line into the marker.

In this design, the inner conductor 4 functions also as a cooling element, conducting heat from the marker 1 to the transfer line TL, thus preventing the active element ACT from heating. The marker container 2 is made of a material which is thermally insulating and the marker 1 is further enclosed in a metal layer 3, which is in electrical and thermal contact with the transfer line sheath 5. Thus, the heat generated in the marker does not have an access through conduction or radiation to the surroundings of the active element, which may be constituted for example by a tissue. The metal layer 3 can also be laid on the inside of the marker container 2, or the metal layer can be on top of the marker container 2, as shown in FIG. 3, but enclosed in yet another thermally insulating layer, for example a plastic film.

The boundary surface between the transfer line TL and the merker 1 and its container 2 is provided with a generally electromagnetic discontinuity, from which the microwave-range input power may be reflected by 90% or more. In such a case, the input power for obtaining the same saturation must be tenfold, as opposed to the situation that all power absorbs in a marker, i.e. the marker is connected to the transfer line in a matched fashion. Impedance matching can be implemented over a wide frequency range (broadband matching) or a narrow frequency range in the environment of an ESR operating frequency. The broadband matching can be implemented by connecting the marker-holding container 2 to the transfer line TL in a tapered fashion. Over the tapered section 7, the marker 1 and the container 2 holding the same have a diameter, a lateral width or height which varies continuously or almost continuously in such a way that a major portion of the cross-sectional area of the transfer line TL is initially constituted by the insulator 6 and a minor portion by the marker 1 and its container assembly 2 but, upon progressing away from the power-supplying microwave generator, the portion of the marker 1 and the container assembly 2 of the total area is increasing. The tapered section's 7 reflection coefficient $\Gamma_i$ of the incoming power is as follows $$\Gamma_i = \frac{1}{2}\int_0^L e^{-j2\beta z}\frac{d}{dz}(\ln \overline{Z})dz, \qquad (2)$$

wherein L represents a total tapering length, $\overline{Z}$ is a normalized impedance for tapering, z, is a distance from the initial point of tapering, $j=\sqrt{-1}$, and $\beta$ is a wave number. The reflection coefficient depends on the taper's impedance and frequency, but generally speaking there is a good match at high frequencies. For example, in the case of exponential tapering, wherein ln $\overline{Z}$ changes linearly as a function of z, the reflected power is about 22% or less of the maximum reflection value, when the input power has a wavelength with a half-number that is equal to or less than the length of tapering.

In the apparatus of the invention, a marker is attached to a microwave power-supplying transfer line in a tapered fashion, and the tapering has a length which is at least half of the wavelength of the applied input power in a transfer line insulator. Such a design is capable of providing a very broadband matching, which offers a major benefit in that the same instrument can be used above a minimum frequency at a low input power at all magnetic field strengths and in all magnetic imaging devices without the need of tuning or matching. Furthermore, it is characteristic of the apparatus of the invention that the marker-containing tapering section of the container is partly or completely housed within the transfer line sheath. Thus, the marker container can be supported on the transfer line sheath and a mechanically stable connection is provided between the container and the transfer line.

The saturation of an enhancer is caused by a magnetic field component of the microwave energy. The desired condition being a powerful saturation, it is also desirable that the magnetic field strength be high. It is possible to increase the power density of saturating radiation in a marker by reflecting the saturating radiation passed through the marker back to its incoming direction. Thus, the marker develops a stationary wave and the magnetic field has a strength in the marker which at the nodal points of a stationary wave is at its maximum twice as high as without reflection. The stationary wave can be produced for example by surrounding the marker by a highly conductive foil, which is in galvanic contact with the grounded sheath of the transfer line. Thus, the saturating radiation having passed through the marker collides with a conductive wall and reflects back into the marker. The stationary wave provides an operation instrument with yet another beneficial feature: the tangential magnetic image of an active element displays bright and dark domains at regular spacings. The bright domains represent maximum points of the magnetic field strength and the dark domains represent minima, and the spacing between adjacent maxima (or minima) is the half-number of the wavelength of saturation power in the marker. This can be exploited in tracking the instrument, for example by counting the number of bright domains in a magnetic image. If this number of lower than what is known to be the number of bright domains on the basis of previous measurements, it is possible to conclude therefrom that a part of the operation instrument is positioned underneath the slice displayed in the magnetic image In the apparatus of the invention, the ESR saturation of a marker is enhanced by producing in the marker a stationary saturation wave. A powerful magnetic field generates in the marker a deep saturation, as a result of which the enhancement of an NMR signal is high even at a minor input power of the microwave. Similarly, if the dimensions of a marker container exceed the wavelength half-number of saturating radiation in the marker, it is possible to exploit a magnetic image produced by the stationary wave of the marker container for tracking and fixing the position of an interventional instrument in a tissue.

Microwave radiation heats a tissue. However, the operation instrument intended for patient examination must not increase the tissue temperature to more than 40° C., as the tissue may be damaged (burn). Since the deep saturation of a marker necessitates a high microwave power, it is possible that such a major portion of this power be absorbed in a surrounding tissue that the heating of the tissue becomes a limiting factor to the applied microwave power. In addition, the marker itself heats up as a result of saturation, and some of this thermal energy migrates into a surrounding tissue through conduction, and the tissue temperature rises. The exposure of a tissue to microwave radiation can be prevented by encapsulating the microwave-radiation containing part of the instrument hermetically in a shield impermeable to microwave radiation. In the case of a microwave-power supplying transfer line, this can be readily accomplished for example by using a metal-sheathed coaxial conductor. In general sense, the encapsulation of a marker-containing section in a conductive shield also prevents the penetration of NMR-frequency radiation through the shield. This cannot be allowed, since in a situation like that the NMR signal emitted by a marker cannot be detected by normal methods of magnetic imaging. However, the problem can be overcome by properly selecting a material and thickness for the shield. The radio- or microwave-frequency radiation is capable of penetrating into a conductive material, such that the components of both an electric and magnetic field will be exponentially damped as a function of the distance from the conductor surface. This is determined by a penetration depth, δ:

$$\delta = \sqrt{\frac{2}{\mu\sigma\omega}}, \qquad (3)$$

wherein $\mu$ represents permeability of the material, $\sigma$ is electrical conductivity of the material, and $\omega$ is the angular frequency of radiation. At the penetration depth, the electric and magnetic field has a strength which is about 36,8% of the strength of the conductive surface. The equation (3) illustrates that the penetration depth depends not only on the properties of a material but also on the frequency of radiation, such that high-frequency radiation has a penetration depth which is less than that of low-frequency radiation. This can be exploited by selecting the shield's material and thickness in such a way that the shield will be practically transparent to the low-frequency RF radiation, while at the same time the high-frequency microwave radiation will be confined inside the shield.

The heat transferring through conduction from a heated marker to a surrounding tissue can be minimized by encapsulating the marker in a sheet of poor thermal conductivity. Its material can be for example glass or plastics, having a thermal conductivity typically less than 1W/(mK), which is much lower than the thermal conductivity of for example copper which is about 400W/(mK).

The marker-containing section in an apparatus of the invention is encapsulated in a conductive shield, having its thickness selected in such a way that the saturating radiation, having passed perpendicularly through a wall and being included in the microwave radiation used for ESR saturation, has a field strength amplitude which is half of or less than the respective field strength value prior to penetration through the wall. The NMR-frequency radiation, having penetrated perpendicularly through the wall simultaneously, has a field strength amplitude which is half of or more than the respective value of the NMR-frequency field strength prior to penetration through the wall. In addition the conductive shield constitutes an excellent electrical and thermal connection with the sheath of a transfer line supplying the microwave power. Furthermore, the apparatus of the invention is provided on the inside or outside or on both sides of the conductive shield with an insulating sheet of poor thermal conductivity, having a thermal conductivity which is 10W/(mK) or lower. This provides three major advantages. Saturating radiation does not heat a tissue directly or indirectly. By virtue of an electrically conductive shield structure, not a single portion of tissue is significantly exposed to microwave radiation, and the shield structure remains cool as it conducts heat to a massive outer conductor of the transfer line. Additionally, the thermally insulating layer surrounding the marker further prevents the outer surface of an operation instrument from developing hot spots which could cause damage to the surrounding tissue. Thirdly, the electrically conductive shield houses a well-defined electric and magnetic environment, nor do the environmental changes, for example the insertion of an operation instrument in a tissue, affect the electrical operation of the apparatus, for example by modifying the excitation or tuning frequency or matching.

The transfer line supplying saturation power can be for example a microstrip, a waveguide, or a coaxial line, provided with one or more inner conductors which can be adjacent or concentric within a common outer conductor. As for these structures, the coaxial line possesses several desirable features: The microwave power is confined within the outer conductor and the conductor does not expose its surrounds to radiation. In addition, the inner conductor or conductors enable the propagation of also such waveforms which have a wavelength with a half-number that exceeds the lateral dimensions of the outer conductor, unlike the case with a hollow-tube transmission line. This is an important feature, since it is desirable that the cross-sectional area of an interventional operation instrument be sufficiently small for accommodating the instrument in small vessels and does not cause major damage when inserted in a tissue. The inner conductor or conductors can also be used for facilitating the delivery of saturation power into a marker if the conductor or the extension thereof extends into the interior of a marker container. Both the electric and magnetic field of a coaxial line have field patterns which are always markedly curvilinear regardless of the number of inner conductors, the geometry of an outer conductor, or the waveform propagating in a conductor. This is a desirable feature when attempting to saturate an enhancer in a homogeneous magnetic field, the magnetic field of saturation power has a strength component which is then always orthogonal-relative to the static magnetic field, which is a requisite for the electron spin saturation of an enhancer. Thus, in a coaxial marker container there is always enhancement of an NMR signal in progress regardless of the position of the instrument relative to the static magnetic field, and no limitations need be set for the orientation of the instrument in a magnetic field during a procedure. Extending into a marker, the inner conductor can also be readily set in good thermal contact with the marker. In this case, this is highly beneficial as the material for an inner conductor can be easily selected to be such (for example metals) that it is also highly conductive of heat whereby, as a result of being inserted within a marker and by virtue of a large contact surface, it cools well the marker by carrying thermal energy out of the marker into the transfer line.

In the apparatus of the invention, the transfer line comprises one or more electrically and thermally highly conductive inner conductors, which are housed in a common outer conductor. Furthermore, the transfer line has its inner conductor or conductors, or the extension thereof, extending into a marker, the saturating radiation propagating effectively into the marker, the enhancement of an NMR signal occurring in all orientations of an operation instrument relative to a static magnetic field, and the inner conductor or conductors carrying effectively the thermal energy generated in the marker into the transfer line, whereby the marker temperature remains low.

The marker is liquid and its volume increases as its temperature increases either as a result of saturating radiation or for some other reason. As a result of the expansion of fluid the pressure in a marker container tends to increase, which in the worst case scenario may break the container or cause a leak in some junction of the container. This cannot be allowed, since holding the marker in a hermetic container is a requisite for the proper working of an operation instrument. In addition, the marker may be non-physiological and the migration thereof into a tissue or the blood circulation must be avoided. The breaking of a container as a result of thermal expansion can be impeded by leaving a small gas bubble in the container. Unlike liquids, the compression of a gas requires just little energy and, by means of a gas bubble, the marker container can be provided with a liquid expansion allowance for preventing the pressure in a container from rising to a dangerous level. In the apparatus of the invention there may be a gas bubble inside the liquid container holding a marker.

The interventional procedure consists of two actions: guiding an instrument to an object to be examined, and performing the actual procedure. An operation instrument is generally inserted in a blood vessel or a soft tissue, such as a muscle or the liver, but the point of the instrument may also meet with a bone during the guidance, and the operation instrument must be able to withstand also this type of strain without breaking. The material for a traditional interventional instrument is a hard metal, for example steel or titanium, nor is its point substantially weaker than the rest of the needle and, thus, hitting a bone with the point does not usually break the instrument. However, if it is desirable to provide the small-sized instrument with a transfer line and a marker sample, it is difficult to fulfil the mechanical strength requirement for the instrument without increasing its outer diameter. In addition, if the instrument should be capable of picking up a sample from a desired object, it must be structurally hollow, or at least the point section must be provided with a container suitable for taking a tissue sample. Furthermore, the materials used in the instrument must be non-magnetic, many of those being soft or brittle and, moreover, in the vicinity of the marker itself, the structurally decisive factors are desired electromagnetic properties, not so much a mechanical strength. Still, the breaking of the operation instrument during a procedure cannot be allowed: if the instrument's hermetic structure fails, the tissue may be exposed to microwave radiation and, moreover, the shattered instrument may leave fragments in the tissue. All in all, these requirements set quite demanding design criteria for the mechanics of an operation instrument.

In the apparatus of the invention, the transfer line is housed in a hollow sheath, such that the marker-containing section remains outside the sheath. If this type of instrument is pressed against a soft tissue, the marker-containing section remains outside the sheath and is detectable in a magnetic image. However, upon pressing the operation instrument against a hard tissue, for example a bone tissue, the marker-containing section is also pushed inside the sheath. The sheath has a sufficient structural strength to withstand such mechanical strain and this way the sheath supports and protects the microwave element whose materials and structure can now be selected from electromagnetical viewpoints only. In addition, in the apparatus of the invention, the microwave element can be withdrawn completely out of the sheath, if desired. This enables for example the withdrawal of a tissue sample by a vacuum suction into the sheath, or the insertion of a second instrument within the sheath into the operation site after the sheath has first been guided by means of the microwave element to a correct object.

The invention provides considerable benefits.

With the operation instrument of this invention, the tracking guided by magnetic imaging can be implemented at a high precision with respect to a surrounding tissue. The instrument is structurally simple and the tracking can be carried out at a low microwave power. In addition, the patient is not exposed to tissue-heating microwave radiation or positioned in contact with hot surfaces. Moreover, the microwave element does not require separate excitation to the applied magnetic field strength, but the same instrument can be used in all practical magnetic imaging devices. Furthermore, the active element has a geometry which is quite insensitive to the position of the operation instrument in a magnetic field, and dynamic nuclear polarization occurs in all positions with respect to the magnetic field. Placing the microwave element inside a separate sheath diminishes the hazard of the device being damaged and improves patient safety. The use of a sheath for taking a sample is optimal as a solution: The location of the sheath is known precisely and thereby it is possible to obtain a tissue sample which is equal to what is obtained with a traditional biopsy needle having an equal outer diameter, despite the fact that, as opposed to the traditional biopsy needle, the operation instrument is further provided with a sophisticated microwave element. In addition, the microwave element has a hermetic structure which enables the use of most chemicals employed in cleaning, and an easy disinfection.

The invention is not limited to the above-described embodiments as other embodiments are conceivable, as well. Naturally, the target nucleus can be any nucleus suitable for NMR tests, such as, for example, nuclei of the NMR-active isotopes of hydrogen, phosphorus, carbon, fluorine, or nitrogen. In addition to medical applications, the method can be used for the examination of animals, foodstuffs, or solid bodies.

What is claimed is:

1. An operation instrument for the examination of an object, comprising an active component which is capable of being detected with a nuclear magnetic resonance method, in such a way that the active component contains a marker which carries NMR-active nuclei and, in interaction therewith, an enhancer which causes the enhancement of an NMR signal by means of dynamic nuclear polarization as a result of saturating the electron spin system of the enhancer with an external energy, so-called saturation energy, said operation instrument comprising a marker container and a transfer line for transferring the saturation energy into the enhancer, wherein the marker is housed in a metal foil, and a boundary surface between the transfer line and the marker container is tapered.

2. An operation instrument for the examination of an object, comprising an active component which is capable of being detected with a nuclear magnetic resonance method, in such a way that the active component contains a marker which carries NMR-active nuclei and, in interaction therewith, an enhancer which causes the enhancement of an NMR signal by means of dynamic nuclear polarization as a result of saturating the electron spin system of the enhancer with an external energy, so-called saturation energy, said operation instrument comprising a marker container and a transfer line for transferring the saturation energy into the enhancer, wherein the marker is housed in a metal foil, and that the transfer line is provided with an inner conductor extending into the marker container over a substantial distance into the interior of the container.

3. An operation instrument as set forth in claim 1, wherein the marker container has its interior enclosed in a thermally insulating layer.

4. An operation instrument as set forth in claim 1, wherein the transfer line is provided with an outer conductor and an inner conductor.

5. An operation instrument as set forth in claim 4, wherein the long and thin operation instrument has a diameter which is less than 4 mm, preferably less than 2.5 mm.

6. An operation instrument as set forth in claim 1, wherein the interior of the marker container contains not only the marker but also a gas bubble.

7. An operation instrument as set forth in claim 1, wherein saturating radiation is adapted to occur also during the monitoring of an NMR signal.

8. An operation instrument as set forth in claim 1, wherein the instrument is further provided with an outer cylinder, which houses the operation instrument constituted by the to transfer line and the active component and which is axially movable for covering or exposing the active component, depending on the operating condition.

9. An operation instrument as set forth in claim 2, wherein the marker container has its interior enclosed in a thermally insulating layer.

10. An operation instrument as set forth in claim 2, wherein the transfer line is provided with an outer conductor and an inner conductor.

11. An operation instrument as set forth in claim 10, wherein the long and thin operation instrument has a diameter which is less than 4 mm.

12. An operation instrument as set forth in claim 2, wherein the interior of the marker container contains not only the marker but also a gas bubble.

13. An operation instrument as set forth in claim 2, wherein saturating radiation is adapted to occur also during the monitoring of an NMR signal.

14. An operation instrument as set forth in claim 2, wherein the instrument is further provided with an outer cylinder, which houses the operation instrument constituted by the transfer line and the active component and which is axially movable for covering or exposing the active component, depending on the operating condition.

* * * * *